(12) United States Patent
Steiper et al.

(10) Patent No.: US 11,736,001 B2
(45) Date of Patent: Aug. 22, 2023

(54) METHOD FOR CAPACITOR DISCHARGING FOR AN INVERTER ASSEMBLY

(71) Applicant: SMA Solar Technology AG, Niestetal (DE)

(72) Inventors: Florian Steiper, Kassel (DE); Christian Gehrke, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/906,070

(22) Filed: Jun. 19, 2020

(65) Prior Publication Data

US 2020/0321852 A1 Oct. 8, 2020

Related U.S. Application Data

(63) Continuation of application No. PCT/EP2018/084994, filed on Dec. 14, 2018.

(30) Foreign Application Priority Data

Dec. 21, 2017 (DE) ..................... 10 2017 130 882.2

(51) Int. Cl.
*H02M 1/36* (2007.01)
*H02J 3/38* (2006.01)
(Continued)

(52) U.S. Cl.
CPC ........ *H02M 1/36* (2013.01); *G01R 19/16528* (2013.01); *H02J 3/381* (2013.01);
(Continued)

(58) Field of Classification Search
CPC .. H02M 2001/322; H02M 1/32; H02M 3/157; H02M 1/36; H02M 3/156;
(Continued)

(56) References Cited

U.S. PATENT DOCUMENTS 6,198,240 B1 * 3/2001 Notohara ............... H02P 29/045
318/722
7,042,178 B2 * 5/2006 Yamada .................. H02P 23/07
318/722
(Continued)

FOREIGN PATENT DOCUMENTS

DE 102004057693 A1 6/2006
DE 102010063126 A1 6/2012
WO 2010133532 A1 11/2010

OTHER PUBLICATIONS

International Search Report dated Mar. 12, 2019 in connection with PCT/EP2018/084994.
(Continued)

*Primary Examiner* — Yusef A Ahmed
(74) *Attorney, Agent, or Firm* — Eschweiler & Potashnik, LLC

(57) ABSTRACT

A method for discharging a capacitor of an input or output circuit arrangement of an inverter for supplying current to a power supply grid includes determining voltage readings at connections of the input or output circuit arrangement and a DC link capacitor of the inverter; and calculating an upper limit voltage value of the DC link capacitor based on the measured values. The method also includes operating a DC/DC converter or a bridge arrangement of the inverter such that energy from the capacitor of the input or output circuit arrangement is transferred to the DC link capacitor, ending the method if the voltage across the DC link capacitor exceeds the upper voltage limit. Otherwise the method continues to transfer energy from the capacitor of the input or output circuit arrangement to the DC link capacitor until the capacitor is discharged to or below a lower limit voltage value.

7 Claims, 2 Drawing Sheets

(51) Int. Cl.
*G01R 19/165* (2006.01)
*H02M 1/32* (2007.01)
*H02M 3/156* (2006.01)
*H02M 7/5387* (2007.01)
*H02M 1/00* (2006.01)

(52) U.S. Cl.
CPC ............. *H02M 1/32* (2013.01); *H02M 3/156* (2013.01); *H02M 7/53871* (2013.01); *H02J 2300/24* (2020.01); *H02M 1/0003* (2021.05); *H02M 1/322* (2021.05)

(58) Field of Classification Search
CPC ........... H02M 7/53871; H02M 1/0003; H02M 1/322; H02M 1/007; H02M 7/5387; H02J 2300/22; H02J 2300/24; H02J 2207/50; H02J 7/345; H02J 3/381; G01R 19/16528; G01R 27/2605; G01R 27/2688; G01R 31/016; G01R 31/64; Y02E 10/56
USPC .................................................. 320/166–167
See application file for complete search history.

(56) References Cited

U.S. PATENT DOCUMENTS

| | | | | |
|---|---|---|---|---|
| 7,868,569 B2 * | 1/2011 | Iwashita | ............. | H02M 5/4585 318/722 |
| 8,537,581 B2 * | 9/2013 | Wagoner | ................ | H02M 1/36 363/40 |
| 9,263,968 B2 * | 2/2016 | Potts | ....................... | H02J 50/70 |
| 2004/0245951 A1 * | 12/2004 | Yamada | .................. | H02P 23/07 318/376 |
| 2005/0169018 A1 * | 8/2005 | Hatai | ................ | H02M 7/53871 363/37 |
| 2005/0231171 A1 * | 10/2005 | Kato | ................... | H02M 5/4585 320/166 |
| 2006/0043946 A1 * | 3/2006 | Rose | ...................... | H02M 1/32 323/280 |
| 2007/0073445 A1 * | 3/2007 | Llorente Gonzalez | ... | H02J 3/46 700/286 |
| 2007/0121354 A1 * | 5/2007 | Jones | ...................... | H02J 3/381 363/67 |
| 2007/0216343 A1 * | 9/2007 | Rozman | .................. | H02P 21/06 318/811 |
| 2007/0296357 A1 * | 12/2007 | Song | ...................... | H02P 23/07 318/139 |
| 2008/0007190 A1 * | 1/2008 | Kunii | ....................... | H02H 7/12 318/141 |
| 2008/0094013 A1 * | 4/2008 | Su | .......................... | H02P 5/747 180/54.1 |
| 2009/0091281 A1 * | 4/2009 | Matsubara | ............ | H02M 5/458 318/440 |
| 2009/0237016 A1 * | 9/2009 | Iwashita | ................ | H02J 7/345 318/400.3 |
| 2010/0090628 A1 * | 4/2010 | Endo | ..................... | B60L 3/0046 318/400.3 |
| 2010/0228416 A1 * | 9/2010 | Sugiyama | ............. | E02F 9/2095 701/22 |
| 2012/0113693 A1 * | 5/2012 | Sekimoto | .............. | H02M 5/458 363/37 |
| 2013/0049478 A1 * | 2/2013 | Wagoner | ................ | H02M 1/36 307/43 |
| 2013/0119923 A1 * | 5/2013 | Wright | .................. | H02J 7/0071 320/166 |
| 2013/0188401 A1 * | 7/2013 | Jin | .......................... | H02H 3/14 363/21.17 |
| 2013/0207619 A1 * | 8/2013 | Viancino | .............. | H03K 17/163 320/166 |
| 2013/0242626 A1 * | 9/2013 | Li | ........................... | H02M 1/32 363/50 |
| 2013/0250641 A1 * | 9/2013 | Falk | ........................ | H02M 1/36 363/131 |
| 2014/0003099 A1 * | 1/2014 | Dillig | .................... | H02M 5/458 363/37 |
| 2014/0095005 A1 * | 4/2014 | Kanzaki | ................. | B60L 3/003 701/22 |
| 2014/0265596 A1 * | 9/2014 | Yuan | ....................... | H02J 3/381 307/69 |
| 2015/0006094 A1 | 1/2015 | Orr | | |
| 2015/0202967 A1 * | 7/2015 | Syed | ....................... | B60L 50/40 320/166 |
| 2015/0365010 A1 * | 12/2015 | Abe | ....................... | H02M 7/06 363/37 |
| 2016/0204691 A1 * | 7/2016 | Okuda | .................... | H02J 3/381 363/55 |
| 2016/0226427 A1 * | 8/2016 | Sakai | ....................... | H02P 27/08 |
| 2016/0315575 A1 * | 10/2016 | Yamamoto | ............. | G01R 31/00 |
| 2019/0260306 A1 * | 8/2019 | Ma | ......................... | H02M 3/158 |
| 2019/0291586 A1 * | 9/2019 | Kim | ........................ | H02J 7/32 |
| 2019/0299792 A1 * | 10/2019 | Kim | ........................ | H02J 7/02 |
| 2020/0274439 A1 * | 8/2020 | Yang | ........................ | H02J 7/007 |
| 2021/0036619 A1 * | 2/2021 | Murakami | .......... | H02M 3/1584 |
| 2021/0167715 A1 * | 6/2021 | Tagawa | .................... | H02P 27/08 |
| 2022/0239146 A1 * | 7/2022 | Tajima | .................... | H02J 9/068 |

OTHER PUBLICATIONS

Gasch, Robert, Twele, Jochen: Wind Power Plants—Fundamentals, Design, Construction and Operation. 2nd Ed . . . Berlin : Springer-Verlag, 2012. S. 396. Fig. 11-32.—ISBN 978-3-642-22938-1.

* cited by examiner

METHOD FOR CAPACITOR DISCHARGING FOR AN INVERTER ASSEMBLY

CROSS REFERENCE TO RELATED APPLICATIONS

This application is a continuation of International Patent Application number PCT/EP2018/084994, filed on Dec. 14, 2018, which claims priority to German Patent Application number 10 2017 130 882.2, filed on Dec. 21, 2017, and is hereby incorporated by reference in its entirety.

FIELD

The disclosure relates to a method for discharging a capacitor of an input or output circuit arrangement of an inverter for supplying current to a power supply grid. The disclosure furthermore relates to an inverter having a control device, which inverter is suitable for performing the method.

BACKGROUND

Grid-tied inverters are used in power supply installations, for example photovoltaic installations and wind power installations. In such an inverter, a voltage that is output at the output of the inverter, or an output current, follows the corresponding characteristic in the power supply grid.

In a photovoltaic installation (PV installation), a photovoltaic generator (PV generator), which can be built up from a plurality of photovoltaic modules in a series and/or parallel circuit, produces a DC voltage that—if necessary after a voltage change by a step-up converter—is supplied to a DC link circuit having a DC link capacitor of the inverter. DC voltage from the DC link circuit is converted by a bridge arrangement of the inverter into an AC current whose frequency and voltage are suitable for supply to the power supply grid. This conversion can produce a single- or polyphase, in particular three-phase, AC current. To convert the DC current (DC—direct current) into AC current (AC—alternating current), the inverter has a bridge arrangement having two or more switching bridges, which are usually fitted with power semiconductor switches actuated in specific modulation patterns. In conjunction with filters arranged at the output of the inverter, a sinusoidal output current, for example, is produced.

For safety reasons, it is desirable or else a legislative requirement for there to be no hazardous voltages present at connections of an inverter whose input and/or output side is disconnected.

The aforementioned output-side filters of the inverter, which are used for shaping a sinusoidal current characteristic, for example, and if necessary for EMC filtering (electromagnetic compatibility filtering), comprise coils and in particular also capacitors arranged between a neutral conductor and a phase conductor or between two phase conductors. Even if the inverter is no longer operated, these capacitors can be charged, which can lead to dangerously high voltages on output lines.

From the document WO 2010/133532 A1 an inverter is known that has a rectifier with a downstream DC/DC converter for supplying power to electronic components of the inverter. According to this document, an output-side capacitor of a filter of the inverter is discharged via the rectifier and the downstream DC/DC converter.

Often, inverters have DC/DC converters in the power path too, in order to be able to match a voltage delivered by the PV generator to the voltage required by the bridge arrangement. Such a DC/DC converter can also be used for power optimization such that the operating voltage of the PV generators is kept at an optimum operating point (MPP—maximum power point) as far as possible by varying the voltage transfer ratio of the DC/DC converter. Such a DC/DC converter, which normally operates as a step-up converter, likewise has capacitors in its input circuits that can still hold a charge after the inverter is disconnected from the PV generator and apply a voltage to the input connections of the inverter. For safety reasons, it is also desirable or a requirement for such capacitors to be discharged when the PV generator is disconnected from the inverter. To this end, it is known practice, for example, to discharge said capacitors via resistors that are permanently connected, or connectable, in parallel with capacitors, after the PV generator is established as having been disconnected from the input connections of the inverter. Establishing that the PV generator has been disconnected from the inverter, and the resistors and if necessary switching elements for intermittently connecting the resistors, lead to additional design complexity for the inverter. If the resistors are permanently connected to the capacitors, power loss occurs that is converted into heat in the resistor(s).

SUMMARY

The present disclosure is directed to a method for operating an inverter in which, without additional design complexity for the inverter, input-side or output-side capacitors of the inverter can be discharged without energy losses arising that adversely affect an energy efficiency of the inverter.

A method according to the disclosure for discharging a capacitor of an input or output circuit arrangement of an inverter for supplying power to a power supply grid comprises the following acts: a supply voltage at connections of the input or output circuit arrangement is determined. A DC link voltage of a DC link capacitor of the inverter is then determined and an upper limit voltage value of the DC link capacitor is determined on the basis of the measured supply voltage and the measured DC link voltage. An input-side DC/DC converter or an output-side bridge arrangement of the inverter is operated such that energy from the capacitor of the input or output circuit arrangement is transferred to the DC link capacitor, wherein the voltage across the DC link capacitor is monitored. The method is ended if the upper limit voltage value is exceeded. Otherwise, the method is continued by continuing to transfer energy from the capacitor of the input or output circuit arrangement to the DC link capacitor until the capacitor is discharged to or below a lower limit voltage value.

Therefore, e.g., by taking into consideration the (known) capacitances of the capacitor to be discharged and the DC link capacitor, it is determined what voltage the DC link capacitor would take if the charge of the capacitor of the input or output circuit arrangement were transferred to the DC link capacitor. The charge transfer is then performed while monitoring the DC link voltage. If the determined maximum value is reached without the input or output voltage having fallen to or below the lower limit voltage value, the method is ended and it can therefore be stated that the inverter was not yet disconnected from the PV generator or the power supply grid. Otherwise, after the method is ended, it is certain that the inverter was actually disconnected from the PV generator or the power supply grid. In that case, the capacitor of the input or output circuit arrangement has at the same time already been discharged.

In an advantageous embodiment of the method, the upper limit voltage value is a calculated voltage obtained if all of the charge of the capacitor of the input or output circuit arrangement were transferred to the DC link capacitor without loss. Accordingly, the capacitor is advantageously substantially fully discharged after the upper limit voltage value has been reached.

A positive offset voltage value can additionally be added to the calculated voltage in order to determine the upper limit voltage value. This additional offset voltage value prevents premature termination of the method that results e.g. from discrepancies between an actual and an assumed capacitance.

In a further advantageous embodiment of the method, the capacitor to be discharged is an energy store of the input-side DC/DC converter, wherein the DC/DC converter is operated as a step-up converter to discharge the capacitor. In this case, the method achieves the effect of rendering the input side de-energized following disconnection from a PV generator.

In a further advantageous embodiment of the method, the capacitor to be discharged is an output-side filter element, wherein the bridge arrangement is operated as a step-up converter to discharge the capacitor. This accordingly prevents a voltage from still being present at the output of the inverter following disconnection from a power supply grid.

In one embodiment, the lower limit voltage value is chosen to be a safe low voltage in order to ensure that the inputs and outputs of the inverter can be touched safely.

In a further advantageous embodiment of the method, a signal is output if the method is terminated on account of the upper limit voltage value being exceeded. The signal indicates whether the method has had to be ended unsuccessfully. It can serve as a warning signal or as a control signal in order to restart the method after a waiting period in which the energy already taken up by the DC link circuit is reduced.

An inverter according to the disclosure has an input-side DC/DC converter, a DC link having a DC link capacitor and an output-side bridge arrangement, and also a control device for actuating semiconductor switching elements of the DC/DC converter and/or the bridge arrangement. The inverter is characterized in that the control device is configured to perform one of the methods described above. The advantages mentioned in context with the methods are obtained.

BRIEF DESCRIPTION OF THE DRAWINGS

The disclosure is explained in more detail below on the basis of example embodiments with reference to figures, in which.

DETAILED DESCRIPTION

Figure 1:
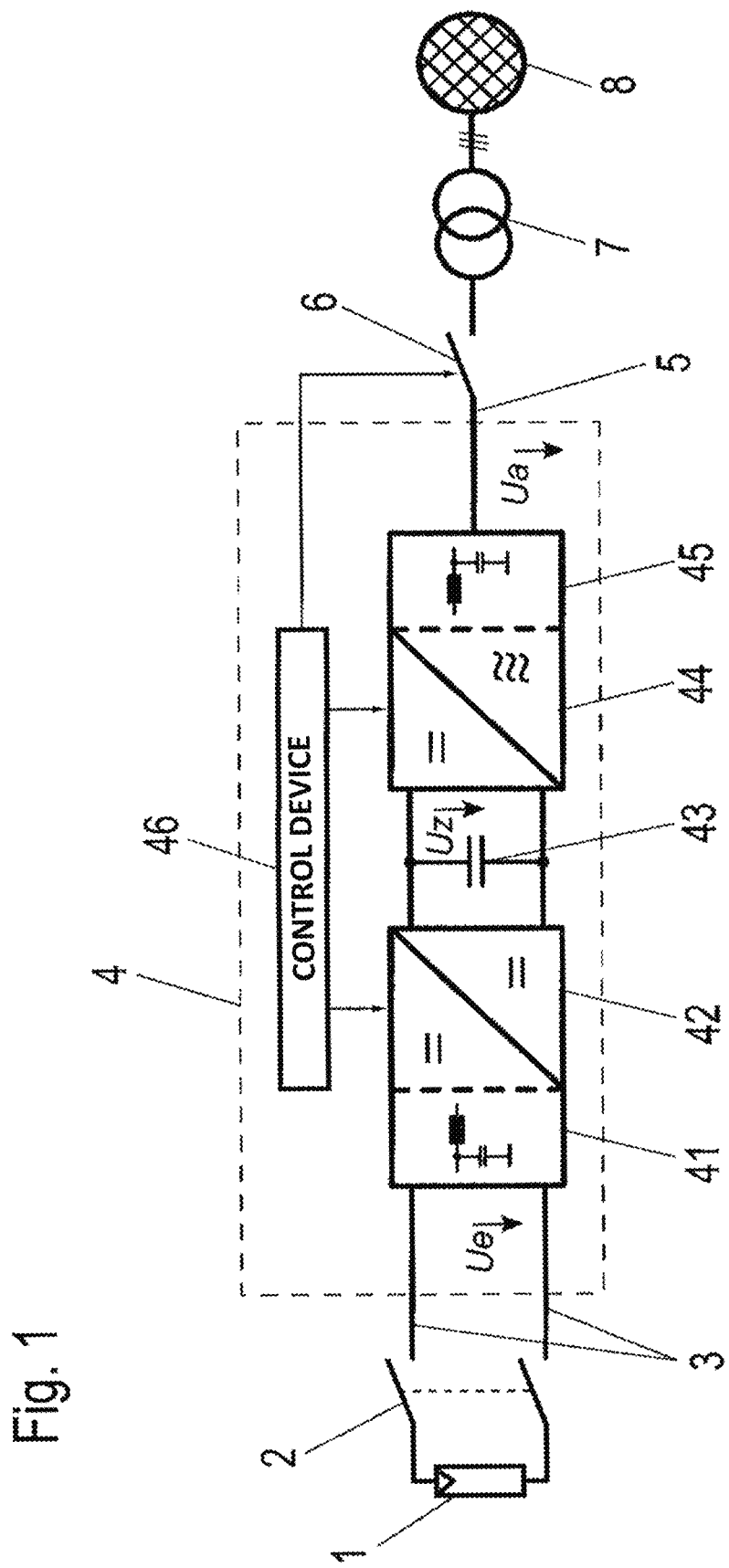
FIG. 1 shows a schematic block diagram of an inverter.

FIG. 1 shows a photovoltaic installation (PV installation) as a power supply installation in a schematic block diagram connected to a power supply grid 8.

The PV installation has a photovoltaic generator (PV generator) 1 that is connected to an inverter 4 via a DC circuit breaker 2 and input lines 3. The inverter 4 in turn is connected to the power supply grid 8 by an output line 5 via an AC circuit breaker 6 and an (optional) transformer 7.

Symbolically, the PV generator 1 is depicted in FIG. 1 only by means of the circuit symbol for a single photovoltaic cell. It goes without saying that the PV generator 1 in an implementation of the depicted PV installation can be built up from a plurality of photovoltaic modules (PV modules) connected in series and/or parallel.

The inverter 4 in the example embodiment comprises an input-side DC/DC converter 42 connected to a bridge arrangement 44 via a DC link circuit having a DC link capacitor 43. The bridge arrangement 44 forms a DC/AC converter by two or more switching bridges. The DC link capacitor 43 is used for smoothing a DC link voltage $U_z$ and allows pulsed current draw by the bridge arrangement 44 without voltage dips in the DC link voltage $U_z$.

The DC/DC converter 42 connected upstream of the DC link circuit allows the voltage of the PV generator 1 to be matched to the desired DC link voltage $U_z$, which is predetermined during operation of the bridge arrangement 44 by a peak voltage in the power supply grid. The DC/DC converter 42 allows the voltage of the PV generator 1 to be varied within wide limits without the DC link voltage $U_z$ deviating from the desired value. The voltage at the input of the DC/DC converter 42 is referred to as the input voltage $U_e$ in the following. The voltage of the PV generator 1 can be varied for example as part of an optimization method, e.g. an MPP tracking method, as a result of which the PV generator 1 is operated at a maximum power point if possible.

Usually, the DC/DC converter 42 is embodied as a step-up converter that converts the voltage delivered by the PV generator 1 to the voltage value of the DC link voltage $U_z$, which is higher in comparison with the input voltage $U_e$. For the step-up conversion, energy stores in the form of (at least) one capacitor and a coil are used, which are depicted symbolically in the input circuit arrangement 41. This typical input circuit arrangement 41 with the shown capacitor results in a voltage being able to be applied to the input connections or the input lines 3 even when the DC circuit breaker 2 is open.

At the output of the bridge arrangement 44, there is an output circuit arrangement 45 that likewise has capacitors and if necessary inductances and that serves as a filter in order to smooth the current delivered in pulses by the bridge arrangement 44. Such an output circuit arrangement 45 is frequently also referred to as a sine filter. For the output circuit arrangement 45 there is also the risk that the respective output connection and the output line 5 have voltage applied even when they are decoupled from the power supply grid 8 by the AC circuit breaker 6.

In the depicted example embodiment, the bridge arrangement 44 is likewise configured to be three-phase, like all downstream components. It goes without saying that the bridge arrangement 44 and accordingly the subsequent components can also have any, in particular a smaller, number of phases.

The inverter 4 also has a control device 46 that actuates, among others, both the DC/DC converter 42 and the bridge arrangement 44. Actuation of the DC/DC converter 42 and of the bridge arrangement 44 should be understood in particular to mean timed switching-on and -off (clocking) of semiconductor switching elements of the DC/DC converter 42 and/or of the bridge arrangement 44. By an appropriate clocking of these semiconductor switching elements both a voltage ratio between the input and the output of the respective converter 42, 44 and a direction of energy flow can be influenced.

Figure 2:
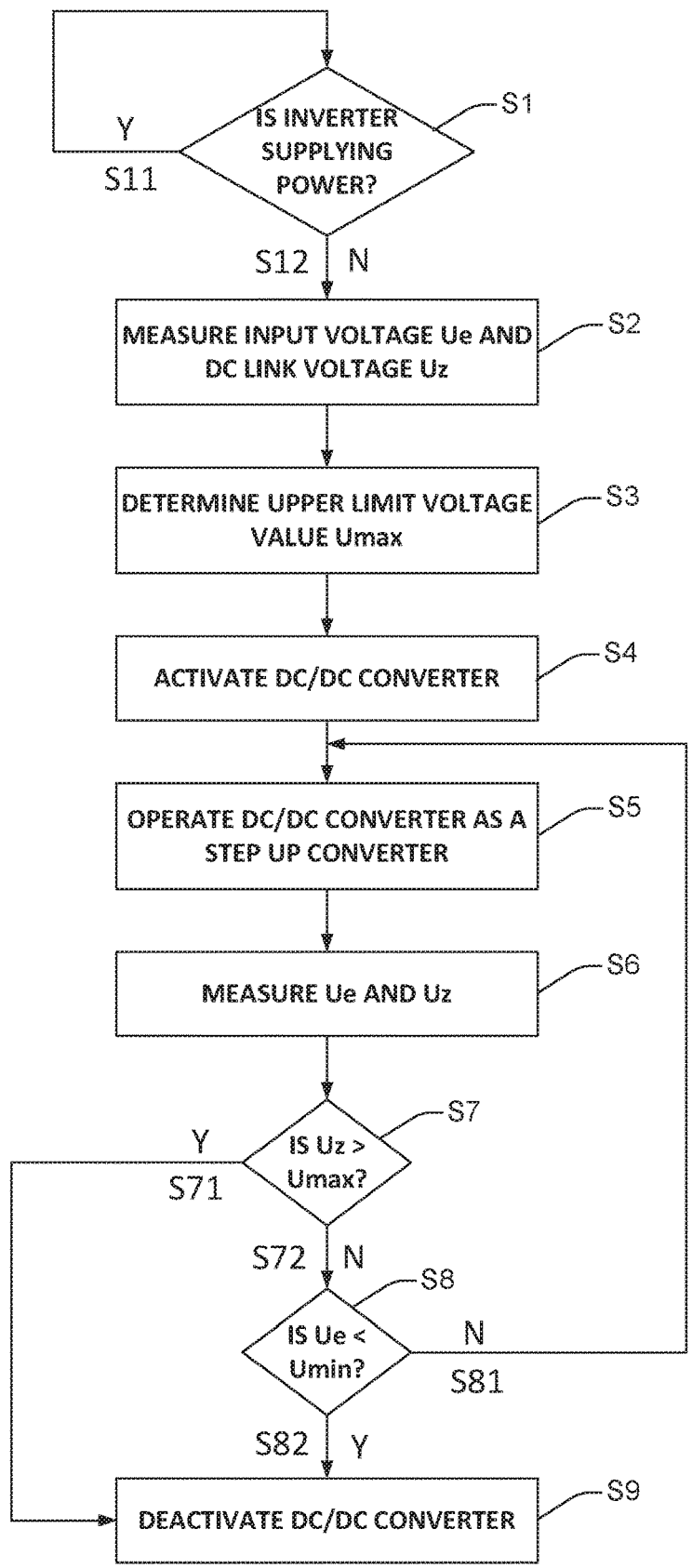
FIG. 2 shows a flowchart of a method for discharging a capacitor of an inverter.

In FIG. 2 a method of operation for discharging a capacitor of an input or output circuit arrangement of an inverter is depicted in the form of a flowchart. The method is described, in an example, with reference to the PV installation shown in FIG. 1.

It is assumed that the inverter is in a supply mode at the start of the method. Supply mode should be understood to mean a mode in which the PV generator 1 delivers power in the form of DC current, which is converted into AC power by the inverter 4 and supplied to the power supply grid 8.

In a first act S1 of the method it is checked whether the inverter is supplying power. For this purpose, current and/or voltage sensors are arranged in the inverter, for example inside the bridge arrangement 44, said sensors being able to be read by the control device 46. If at S1 it is determined that the inverter is still supplying power (case S11), the method branches back, and performs act S1 again. If the inverter is no longer supplying power (case S12), the method branches to S2.

One reason for the inverter no longer supplying power can be that the PV generator 1 was decoupled from the inverter 4, for example in the event of a fire or for maintenance purposes. In these cases, the DC circuit breaker 2 was opened, for example. After, at S1 it is determined that the inverter is no longer supplying power, it should then be ensured that the input connections of the inverter 4, which have the input lines 3 connected to them, are de-energized.

With the steps that follow in the depicted method it is determined whether the PV generator 1 is still connected to the inverter and the capacitor of the input circuit arrangement 41 is drained, if necessary.

For this purpose, act S2 at first the input voltage Ue of the inverter 4 and the DC link voltage Uz across the DC link capacitor 43 of the inverter 4 are measured.

In a subsequent act S3 an upper limit voltage value Umax is determined from the values read in at S2, specifically as the voltage that would be applied to the DC link capacitor 43 if all of the charge of the capacitor of the input circuit arrangement 41 were transferred to the charge that the DC link capacitor 43 already contains, without charges or currents otherwise flowing out or in. This calculation can be performed given the knowledge of the capacitances of the capacitor of the input circuit arrangement 41 and of the DC link capacitor 43 and the known correlation between charge and voltage of a capacitor for a given capacitance. The calculation can involve the upper limit voltage value Umax being increased by a positive offset in comparison with the calculation value, for example by up to a few 10 s of volts. This is used to prevent the likelihood of an incorrect termination of the method during act S7, which is explained below.

In a next act S4 the DC/DC converter 42 is activated and preparations are made for passing through a voltage ramp for the voltage at the input of the inverter. The voltage ramp has a negative slope, that is to say moves toward lower input voltages down to the target value "0 volt". The voltage ramp is passed through in a subsequent act S5, wherein the DC/DC converter 42 is operated as a step-up converter in such a way that the charge of the capacitor of the input circuit arrangement 41 is transferred to the DC link capacitor 43. Accordingly, the voltage of the input circuit arrangement 41 will continually decrease if the input circuit arrangement 41 is actually decoupled from the PV generator 1.

In a following act S6 the input voltage Ue and the DC link voltage Uz are again read in (comparably to act S2).

In a subsequent act S7 and a then subsequent act S8 the voltages measured at S6 are checked, specifically by at first being checked in at S7 whether the DC link voltage Uz exceeds the upper limit voltage value Umax calculated in at S3.

If the DC link voltage exceeds the calculated voltage Umax (case S71), the method branches to act S9, in which the DC/DC converter 42 is deactivated. The reaching or exceeding of the maximum voltage Umax shows that the PV generator 1 is not decoupled from the inverter 4, which is why more charge was transferred to the DC link capacitor 43 than can be stored by the input circuit arrangement 41. The capacitor of the input circuit arrangement 41 therefore cannot be discharged in this operating state of the PV installation, which is why the method is terminated without discharging the capacitor.

After the method has been terminated, there is the possibility of it being restarted after a certain waiting period, so as then to bring it to a successful completion, if necessary. This can be necessary for example if the inverter 4 was decoupled from the PV generator 1 in the meantime. During the waiting period, the DC link capacitor 43 needs to be discharged, for example by virtue of the energy stored thereby being delivered to an onboard electrical system of the inverter 4 that is used for the intrinsic supply for the inverter 4. Said waiting period can be prescribed or can also be determined by measuring the DC link voltage Uz. The method is then restarted if the DC link voltage Uz has fallen to or below a predetermined value.

If case S71 has not arisen at S7, that is to say in case S72, in the next act S8 it is checked whether the input voltage Ue has fallen below a lower limit voltage value Umin. This lower limit voltage value Umin is chosen to be so low that a voltage beneath can be regarded as safe. It is in the range of <30 V, for example.

If this lower limit voltage value Umin has not yet been reached at the input connections (case S81), the method branches back to S5, i.e. the DC/DC converter 42 continues to transfer charge from the capacitor of the input circuit arrangement 41 to the DC link capacitor 43, and the input voltage Ue and the DC link voltage Uz are measured and again compared. The loop thus formed in the method sequence results in the charge transfer to the DC link capacitor 43 being (more or less) continually monitored.

If at S8 it is determined that the input voltage Ue has fallen below the lower limit voltage value Umin (case S82), the method is likewise ended at S9. In this case, the method has detected that the PV generator 1 is no longer connected to the inverter 4, and at the same time the capacitor of the input circuit arrangement 41 has already been discharged.

Comparably, the method shown in FIG. 2 can be used to bring a voltage at the output of the inverter 4, that is to say for example at the output line 5, to or below a safe value, which is lower than the lower limit voltage value Umin.

The initial situation for such a method is, for example, that the AC voltage in the power supply grid 8 disappears, e.g. on account of a collapse of one or more phases in the power supply grid 8. After such a situation has been detected, the inverter 4 stops the supply mode. Before the AC circuit breaker 6 is used to disconnect the inverter 4 from the power supply grid 8, however, it should be ensured that output connections no longer have a voltage. It could be that capacitors of the output circuit arrangement 45 still hold a charge, which means that there is a possibly hazardous voltage at the output of the inverter 4. A high voltage at the output of the inverter 4 could also result in damage to electrical loads that are still connected to the inverter 4, e.g. after a main fuse of a residential building to the power supply grid 8 has tripped.

Comparably to act S2 in the method described above, the output voltage Ua and the DC link voltage Uz are then measured and, again taking into consideration the known capacitances, an upper limit voltage value Umax that would result if all of the charge of the capacitor(s) of the output circuit arrangement 45 were transferred to the DC link capacitor 43 is calculated in accordance with act S3.

Subsequently, comparably to acts S4 and S5, the bridge arrangement 44 is operated such that a transfer of charge and power from the output to the input of the bridge arrangement 44, that is to say to the DC link circuit, takes place. Again, comparably to act S6, the DC link voltage Uz and the voltage of the capacitor to be drained, that is to say in this case the voltage Ua of the capacitor of the output circuit arrangement 45, are read in. In a following step, analogously to act S7, it is checked whether the voltage of the DC link capacitor 43 exceeds the calculated upper limit voltage value Umax (case S71).

If case S71 is detected, in a next act, analogously to act S9, the operation of the bridge arrangement 44 is stopped in order to prevent the voltage in the DC link circuit from rising ever further, for example because a grid fault in the power supply grid 8 was incorrectly detected. This prevents the DC link capacitor 43 from being damaged.

If case S71 does not arise at S7, the method is continued (case S72) until the capacitors in the output circuit arrangement 45 are brought to a voltage that is lower than the lower limit voltage value Umin (analogously to act S8, case S82), whereupon the method is successfully ended. In this case, the clocking of the bridge arrangement 44 can be stopped. Subsequently, the AC circuit breaker 6 can be opened and the inverter 4 can be disconnected from the power supply grid 8.

The invention claimed is:

1. A method for discharging a capacitor of an input or output circuit arrangement of an inverter for supplying current to a power supply grid, comprising:
   determining a supply voltage at connections of the input or output circuit arrangement;
   determining a DC link voltage of a DC link capacitor of the inverter;
   calculating an upper limit voltage value of the DC link capacitor based on the determined supply voltage and the determined DC link voltage, wherein the upper limit voltage value is a calculated voltage obtained by a resultant voltage when all of a charge of the capacitor of the input or output circuit arrangement is transferred to the DC link capacitor without loss;
   operating an input-side DC/DC converter or an output-side bridge arrangement of the inverter such that energy from the capacitor of the input or output circuit arrangement is transferred to the DC link capacitor, wherein the voltage across the DC link capacitor is monitored; and
   ending the method by deactivating the input-side DC/DC converter or the output-side bridge arrangement of the inverter, respectively, when the voltage across the DC link capacitor exceeds the upper limit voltage value, and
   when the voltage across the DC link capacitor does not exceed the upper limit voltage value, continuing to transfer energy from the capacitor of the input or output circuit arrangement to the DC link capacitor until the capacitor is discharged to or below a lower limit voltage value.

2. The method as claimed in claim 1, wherein a positive offset voltage value is additionally added to the calculated voltage in order to determine the upper limit voltage value.

3. The method as claimed in claim 1, wherein the capacitor to be discharged is an energy store of the input-side DC/DC converter, and wherein the input-side DC/DC converter is operated as a step-up converter to discharge the capacitor.

4. The method as claimed in claim 1, wherein the capacitor to be discharged is an output-side filter element, and wherein the output-side bridge arrangement is operated as a step-up converter to discharge the capacitor.

5. The method as claimed in claim 1, wherein the lower limit voltage value is 30 V.

6. A method for discharging a capacitor of an input or output circuit arrangement of an inverter for supplying current to a power supply grid, comprising:
   determining a supply voltage at connections of the input or output circuit arrangement;
   determining a DC link voltage of a DC link capacitor of the inverter;
   calculating an upper limit voltage value of the DC link capacitor based on the determined supply voltage and the determined DC link voltage;
   operating an input-side DC/DC converter or an output-side bridge arrangement of the inverter such that energy from the capacitor of the input or output circuit arrangement is transferred to the DC link capacitor, wherein the voltage across the DC link capacitor is monitored;
   ending the method by deactivating the input-side DC/DC converter or the output-side bridge arrangement of the inverter, respectively, when the voltage across the DC link capacitor exceeds the upper limit voltage value, and
   when the voltage across the DC link capacitor does not exceed the upper limit voltage value continuing to transfer energy from the capacitor of the input or output circuit arrangement to the DC link capacitor until the capacitor is discharged to or below a lower limit voltage value; and
   outputting a signal when the method is ended on account of the upper limit voltage value being exceeded.

7. An inverter having an input-side DC/DC converter, a DC link having a DC link capacitor and an output-side bridge arrangement, and a control device for actuating semiconductor switching elements of the input-side DC/DC converter or the output-side bridge arrangement, or both, wherein the control device is configured to:
   determine a supply voltage at connections of the input-side DC/DC converter or the output-side bridge arrangement;
   determine a DC link voltage of the DC link capacitor of the inverter;
   calculate an upper limit voltage value of the DC link capacitor based on the determined supply voltage and the determined DC link voltage, wherein the upper limit voltage value is a calculated voltage obtained by a resultant voltage when all of a charge of a capacitor of an input or output circuit arrangement of the inverter is transferred to the DC link capacitor without loss;
   operate the input-side DC/DC converter or the output-side bridge arrangement of the inverter such that energy from the capacitor of the input or output circuit arrangement is transferred to the DC link capacitor, wherein a voltage across the DC link capacitor is monitored; and end a control of the control device by deactivating the input-side DC/DC converter or the output-side bridge arrangement of the inverter, respectively, when the voltage across the DC link capacitor exceeds the upper limit voltage value, and when the voltage across the DC link capacitor does not exceed the upper limit voltage value, continue to transfer energy from the capacitor of the input or output circuit arrangement to the DC link capacitor until the capacitor is discharged to or below a lower limit voltage value.

* * * * *